(12) United States Patent
Westby

(10) Patent No.: US 7,430,908 B2
(45) Date of Patent: Oct. 7, 2008

(54) EXCITATION IN MICROMECHANICAL DEVICES

(75) Inventor: Esklid Westby, Horten (NO)

(73) Assignee: Infineon Technologies Sensonor AS, Horten (NO)

( * ) Notice: Subject to any disclaimer, the term of this patent is extended or adjusted under 35 U.S.C. 154(b) by 49 days.

(21) Appl. No.: 11/539,182

(22) Filed: Oct. 6, 2006

(65) Prior Publication Data

US 2007/0111363 A1    May 17, 2007

(30) Foreign Application Priority Data

Nov. 4, 2005    (EP)    ................................. 05256843

(51) Int. Cl.
*G01P 15/08* (2006.01)
(52) U.S. Cl. .................................. 73/504.04; 73/514.15
(58) Field of Classification Search .............. 73/504.02, 73/504.04, 504.12, 504.14, 504.15, 514.15, 73/514.16, 514.29

See application file for complete search history.

(56) References Cited

U.S. PATENT DOCUMENTS

| 4,732,647 | A |   | 3/1988 | Aine |
| 5,203,208 | A | * | 4/1993 | Bernstein ................. 73/504.12 |
| 6,032,531 | A | * | 3/2000 | Roszhart ................... 73/504.04 |
| 6,584,845 | B1 | * | 7/2003 | Gutierrez et al. ......... 73/514.15 |
| 2003/0196490 | A1 |   | 10/2003 | Cardarelli |

FOREIGN PATENT DOCUMENTS

DE    4228795 A1    3/1994

* cited by examiner

*Primary Examiner*—Helen C. Kwok
(74) *Attorney, Agent, or Firm*—Edell, Shapiro & Finnan, LLC

(57) ABSTRACT

A resonant structure for a micromechanical device includes a beam and at least one mass attached to the beam. The resonant structure is arranged to have a predominantly rotational excitation mode and an excitation plane in which motion of the excited resonant structure predominantly takes place, the at least one mass including a geometry such that none of the principal axes of the rotational inertia tensor of the resonant structure are normal to the excitation plane.

14 Claims, 4 Drawing Sheets

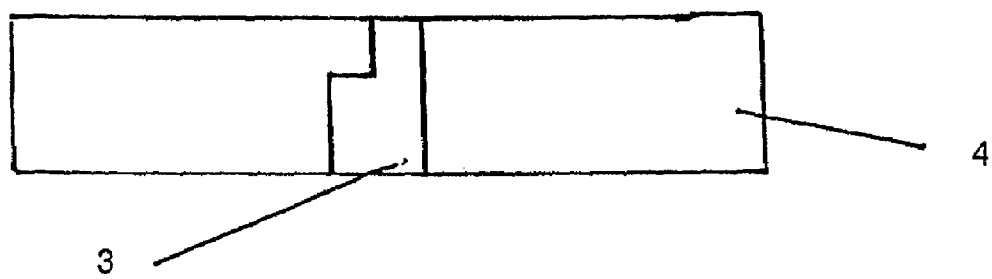
Figure 1: Prior Art
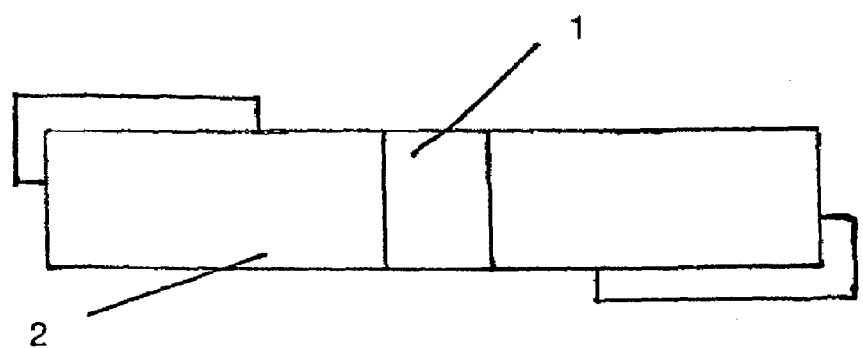
Figure 2

EXCITATION IN MICROMECHANICAL DEVICES

CROSS REFERENCE TO RELATED APPLICATIONS

This application claims priority under 35 U.S.C. §119 to Application No. EP 05256843.3 filed on Nov. 4, 2005, entitled "Excitation in Microchemical Devices," the entire contents of which are hereby incorporated by reference.

FIELD OF THE INVENTION

The present invention relates to excitation of structures in micromechanical devices.

BACKGROUND

Micromechanical sensing devices are known which sense external movement through changes in the motion of an excited sensing element. An example of such a sensing device is an angular rate sensor, used in applications such as rollover detection for vehicles.

The necessary positioning of components in a device such as an angular rate sensor is such that the excitation of the resonant structure which comprises the sensing element has to be driven in a plane normal to the desired plane of the excited motion. In an angular rate sensor, excitation electrodes must excite the sensing element of the sensor to a vibration mode which is essentially a motion parallel to the surface of the excitation electrodes. This means that the device must be designed so that the excitation motion has components in a direction normal to the desired plane of the excited motion.

A sensing element of such a sensor comprises one or more masses attached to a beam. Current devices achieve the desired excitation characteristics via beams with a specially designed geometry. The cross-section of the beam is created to be asymmetric and has a geometry such that its principal axis is not parallel to the surface normal of the mass (see FIG. 1). Therefore, the beam has a tendency to bend out of the surface. The result is that an excitation mode has small components out of the surface plane of the mass and hence can be driven electrostatically from the side of the plane of the mass.

A problem with this approach is that, due to the relatively small sizes of the beams, process tolerances influence the properties and principal axis of the beam, process tolerance control is therefore a major issue in the fabrication process. This is also the case for other micromechanical devices using resonant structures.

SUMMARY

According to the present invention, there is provided a resonant structure for a micromechanical device, the resonant structure including a beam and at least one mass attached to the beam. The resonant structure is arranged to have a predominantly rotational excitation mode and an excitation plane in which motion of the excited resonant structure predominantly takes place in use. The at least one mass has a geometry such that none of the principal axes of the rotational inertia tensor of the resonant structure are normal to the excitation plane.

The present invention also relates to a micromechanical device including: at least one resonant structure as defined above; and excitation component arranged to excite motion of the resonant structure.

In addition, a method is provided for exciting a resonant structure in an excitation plane in a micromechanical device, the method including: providing a resonant structure including at least one mass having a geometry such that none of the principal axes of the rotational inertia tensor of the resonant structure are normal to the excitation plane; and exciting motion of the resonant structure in a direction normal to the excitation plane.

The above and still further features and advantages of the present invention will become apparent upon consideration of the following definitions, descriptions and descriptive figures of specific embodiments thereof, wherein like reference numerals in the various figures are utilized to designate like components. While these descriptions go into specific details of the device, it should be understood that variations may and do exist and would be apparent to those skilled in the art based on the descriptions herein.

BRIEF DESCRIPTION OF THE DRAWINGS

The invention is explained in more detail below with reference to exemplary embodiments, where:

FIG. 1 is a schematic cross-sectional diagram of a prior art sensing element;

FIG. 2 is a schematic cross-sectional diagram of the concept of a sensing element according to the present invention;

DETAILED DESCRIPTION

In the following detailed description, reference is made to accompanying drawings which form a part hereof and in which is illustrated by way of illustration, specific embodiments in which the device may be practiced. In this regard, directional terminology such as: "xy-plane", "z-direction", "x'-axis", "z'-axis", etc. is used with reference to the orientation of the figures being described. Because components of the embodiments of the present invention can be positioned in a number of different orientations, the directional terminology is used for purposes of illustration and is no way limiting.

Referring to FIG. 2, a resonant structure according to the device comprises a beam 1 with a regularly shaped, for example rectangular, cross-section and one or more masses 2 with irregularly shaped cross-sections. The resonant structure may be, for example, a sensing element or part of a device which 'harvests' energy from rotation of a wheel for powering a device such as a sensing device. This is compared to prior art sensing elements, depicted in FIG. 1, which comprise a beam 3 with an irregular cross-section and regularly shaped masses 4.

Examples of different possible geometries of the masses 2 are shown in FIGS. 3A to 3E, with altered principal axes shown as x' and z'. The geometry of the masses 2 is such that their rotational inertial mass tensor has principal axes that are not normal to the surface of the masses (xy-plane in figures). This results in an excitation mode that has small components out of the surface, which enables excitation and detection of the resonant structure to occur from a single side of the resonant structure, which may be a sensing element.

In FIGS. 3A to 3E, it would be desired to excite motion in the xy-plane. Then, for example, external angular movement (such as of a vehicle in which the sensing element is located) causing Coriolis forces on the resonant structure can be detected by detecting the resultant movement of the resonant structure in the z-direction. The existence of components of the excited mode normal to the xy-plane, i.e., in the z-direction, means that it is possible to indirectly drive the desired excited motion in the xy-plane by use of an excitation component which acts to cause excitation in the z-direction.

Figure 3A:
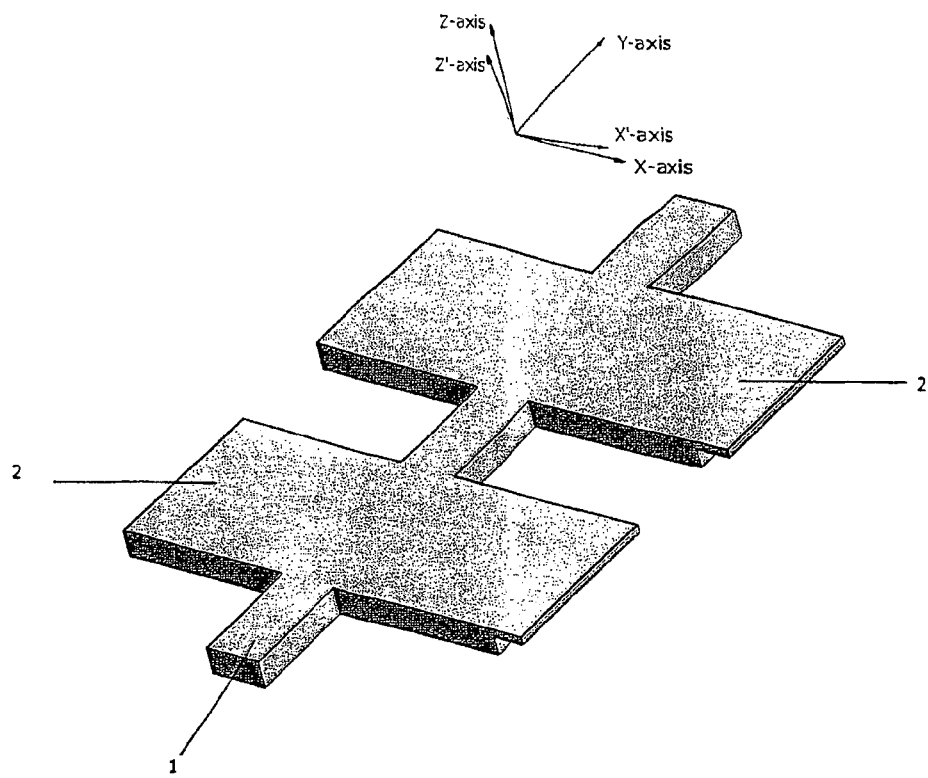
FIGS. 3A to 3E show perspective diagrams of sensing elements according to the present invention with various example geometries.
Figure 3B:
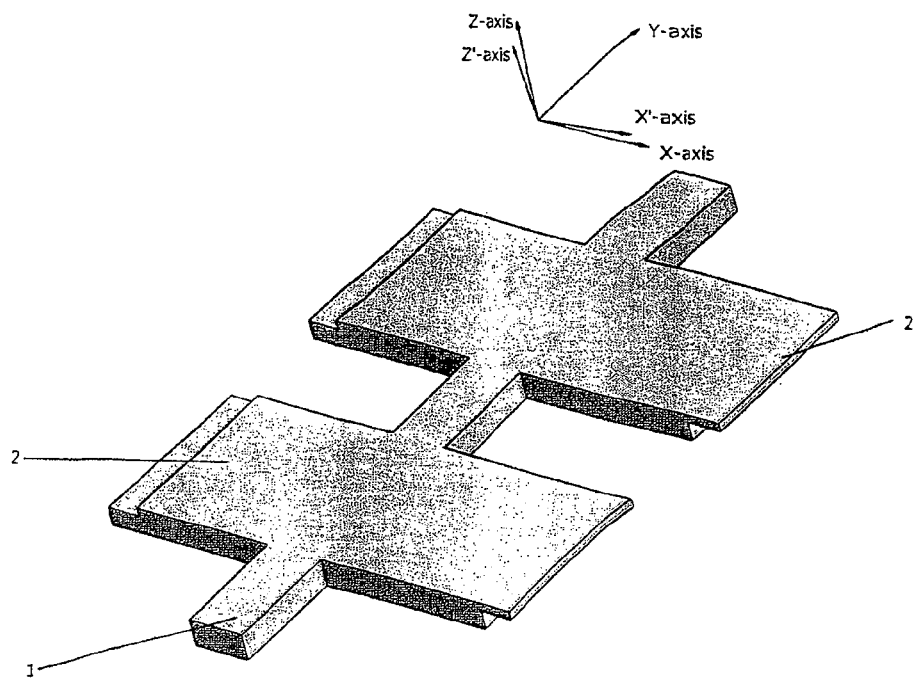
Figure 3C:
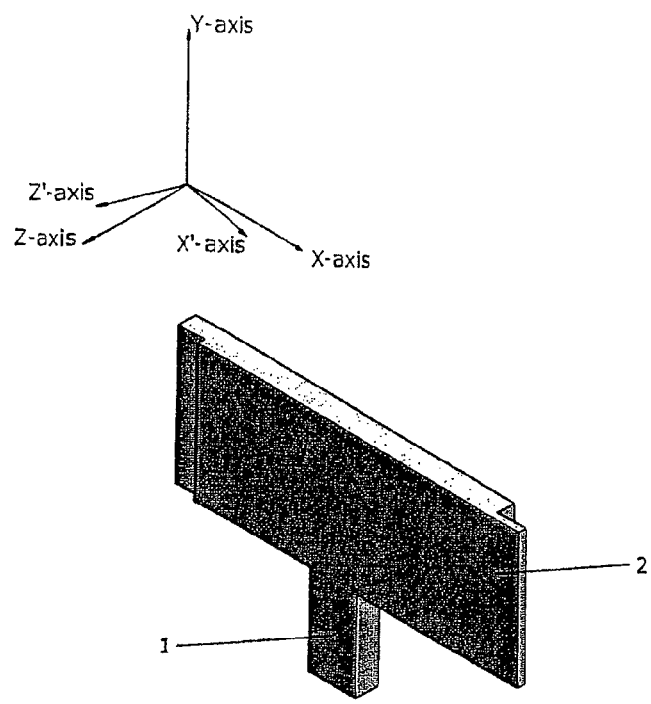
Figure 3D:
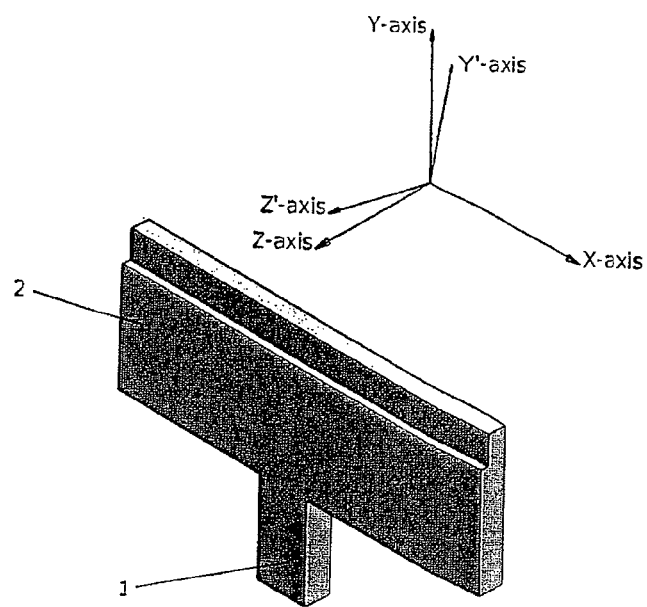
Figure 3E:
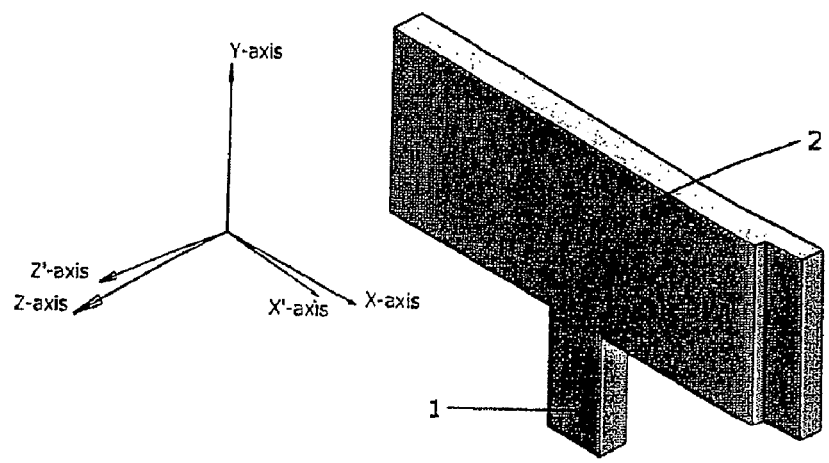
Figure 4:
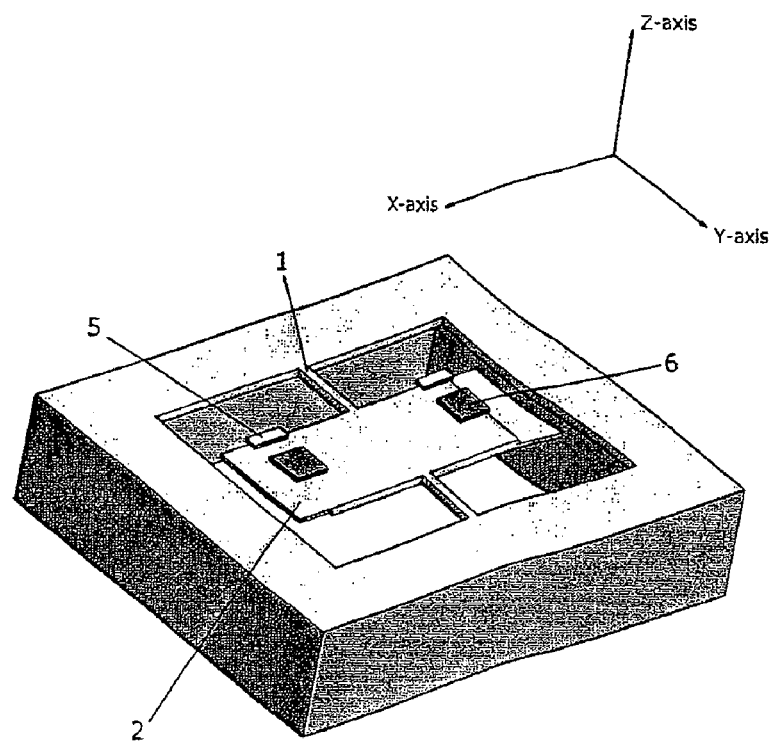
FIG. 4 shows an example micromechanical device comprising a sensing element, according to the present invention.

An example micromechanical sensing device comprising a resonant structure functioning as a sensing element of the present invention is shown in FIG. 4. This example device has excitation electrodes 5 and detection electrodes 6 and senses angular rate about an axis parallel to the xy-plane. A device may comprise more than one such resonant structure.

With a sensing element according to the present invention it is possible to make a sensing device which exhibits equivalent behavior to conventional devices with irregular beam cross-sections, but with the advantage of the device being more robust towards process tolerances.

Another example use for a resonant structure according to the present invention is in a power generation device for use on a wheel, where Coriolis movement can be converted into useful energy, some of which can be fed back into the device to drive the excitation component and some of which can be used to power a sensing device on the wheel. The resonant structure is suitable for use in any such device where the vibratory motion is mainly rotational.

While the invention has been described in detail with reference to specific embodiments thereof, it will be apparent to one of ordinary skill in the art that various changes and modifications can be made therein without departing from the spirit and scope thereof. Accordingly, it is intended that the present invention covers the modifications and variations of this device provided they come within the scope of the appended claims and their equivalents.

What is claimed is:

1. A micromechanical device comprising:
a resonant structure comprising a beam; and at least one mass attached to the beam; and
an excitation component configured to excite motion of the resonant structure;
wherein the resonant structure is configured to have a predominantly rotational excitation mode defined in an excitation plane in response to the resonant structure being excited, and the at least one mass includes a suitable geometry that prevents any principal axis of a rotational inertia tensor of the resonant structure from being normal to the excitation plane.

2. The device according to claim 1, wherein the beam comprises a rectangular cross-section normal to the excitation plane.

3. The device according to claim 1, wherein the at least one mass is asymmetric about an axis through a center of the beam and parallel to a length of the beam.

4. The device according to claim 1, wherein the at least one mass comprises a two-fold rotational symmetry about an axis through a center of the beam and parallel to a length of the beam but no minor symmetry about the same axis.

5. The device according to claim 1, wherein the resonant structure comprises a sensing element.

6. The device according to claim 1, wherein the micromechanical device comprises a sensing device and the excitation component is configured to excite motion of the sensing element in a direction normal to the excitation plane, and the device further comprises a detection component configured to detect a motion in a direction normal to the excitation plane and that is not caused by the excitation component.

7. The device according to claim 1, wherein the resonant structure is arranged to be excitable to a predominantly rotational excitation mode.

8. The device according to claim 1, wherein the micromechanical device comprises a power generation device and the resonant structure is arranged to be excitable to a predominantly rotational excitation mode, the resonant structure being fixed to a wheel such that the rotation axis of the excited resonant structure is substantially perpendicular to the rotation axis of the wheel, and the device further comprises a power extraction component configured to generate power via converting Coriolis motion of the excited resonant structure.

9. The device according to claim 1, wherein the excitation component is configured to electrostatically excite motion of the resonant structure.

10. A method of exciting a resonant structure in an excitation plane in a micromechanical device, the method comprising:
providing a resonant structure including at least one mass with a suitable geometry that prevents any principal axis of a rotational inertia tensor of the resonant structure from being normal to the excitation plane; and
exciting motion of the resonant structure in a direction normal to the excitation plane.

11. The device of claim 1, wherein the resonant structure is configured with a suitable geometry of the at least one mass so as to prevent any principal axis of a rotational inertia tensor of the resonant structure from being normal to the excitation plane in response to the resonant structure being excited without requiring a movement of any mass associated with the resonant structure or any modification of a center of mass of the resonant structure.

12. The method of claim 10, wherein the resonant structure is configured with a suitable geometry of the at least one mass so as to prevent any principal axis of a rotational inertia tensor of the resonant structure from being normal to the excitation plane in response to the resonant structure being excited without requiring a movement of any mass associated with the resonant structure or any modification of a center of mass of the resonant structure.

13. The device of claim 1, wherein at least one mass of the resonant structure includes an irregular geometry with at least one side of the mass comprising two surfaces that are non-planar with each other such that a stepped transition exists between the two surfaces.

14. The method of claim 10, wherein at least one mass of the resonant structure includes an irregular geometry with at least one side of the mass comprising two surfaces that are non-planar with each other such that a stepped transition exists between the two surfaces.

* * * * *

UNITED STATES PATENT AND TRADEMARK OFFICE
CERTIFICATE OF CORRECTION

| | | |
|---|---|---|
| PATENT NO. | : 7,430,908 B2 | Page 1 of 1 |
| APPLICATION NO. | : 11/539182 | |
| DATED | : October 7, 2008 | |
| INVENTOR(S) | : Esklid Westby | |

It is certified that error appears in the above-identified patent and that said Letters Patent is hereby corrected as shown below:

Column 3, line 57: replace "minor" with -- mirror --.

Signed and Sealed this

Twenty-third Day of December, 2008

JON W. DUDAS
*Director of the United States Patent and Trademark Office*